United States Patent
Lin et al.

(10) Patent No.: US 9,679,653 B2
(45) Date of Patent: *Jun. 13, 2017

(54) PROGRAMMING SCHEME FOR NEXT STARTING PULSE BASED ON A CURRENT PROGRAM PULSE FOR IMPROVING PROGRAMMING SPEED

(71) Applicant: MACRONIX INTERNATIONAL CO., LTD., Hsinchu (TW)

(72) Inventors: Ming-Chao Lin, Taichung (TW); Han-Sung Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/862,064

(22) Filed: Sep. 22, 2015

(65) Prior Publication Data

US 2016/0012899 A1    Jan. 14, 2016

Related U.S. Application Data

(63) Continuation of application No. 14/210,063, filed on Mar. 13, 2014, now Pat. No. 9,171,628.

(51) Int. Cl.
*G11C 16/34* (2006.01)
*G11C 16/10* (2006.01)

(52) U.S. Cl.
CPC .......... *G11C 16/10* (2013.01); *G11C 16/3459* (2013.01)

(58) Field of Classification Search
CPC ..... G11C 16/12; G11C 16/10; G11C 16/3404; G11C 16/34; G11C 16/3459; G11C 16/3463; G11C 16/3454; G11C 13/0064; G11C 2013/0064

See application file for complete search history.

(56) References Cited

U.S. PATENT DOCUMENTS

| | | | |
|---|---|---|---|
| 5,602,789 A | 2/1997 | Endoh et al. | |
| 6,657,891 B1 | 12/2003 | Shibata et al. | |
| 8,254,177 B2 * | 8/2012 | Hemink | G11C 11/5628 365/185.03 |
| 8,711,616 B2 * | 4/2014 | Sarin | G11C 11/5628 365/185.03 |
| 8,879,318 B2 * | 11/2014 | Ahn | G11C 16/0483 365/185.03 |

(Continued)

OTHER PUBLICATIONS

Suh et al., "A 3.3 V 32 Mb NAND Flash Memory with Incremental Step Pulse Programming Scheme," IEEE Journal of Solid-State Circuits, vol. 30, No. 11, Nov. 1995, pp. 1149-1156.

*Primary Examiner* — Andrew Q Tran
(74) *Attorney, Agent, or Firm* — Haynes Beffel & Woldfeld LLP

(57) ABSTRACT

A method for programming a memory including a plurality of memory cells is provided. The method comprises selecting a cell and executing a program and program verify operation for the cell, including applying a sequence of program pulses and performing program verify steps. The sequence includes a starting pulse having a starting magnitude. The program verify steps use a program verify level. The method also comprises determining the starting magnitude for a next cell as a function of a magnitude of the program pulse in an instance of the program verify step in which the current cell passes verify at the program verify level.

14 Claims, 7 Drawing Sheets

(56) References Cited

U.S. PATENT DOCUMENTS

| | | | |
|---|---|---|---|
| 9,082,487 B2* | 7/2015 | Koo | G11C 16/10 |
| 9,171,628 B2 | 10/2015 | Lin et al. | |
| 2014/0211565 A1* | 7/2014 | Song | G11C 11/5628 |
| | | | 365/185.03 |

* cited by examiner

PROGRAMMING SCHEME FOR NEXT STARTING PULSE BASED ON A CURRENT PROGRAM PULSE FOR IMPROVING PROGRAMMING SPEED

RELATED APPLICATIONS

This application is a continuation of U.S. patent application Ser. No. 14/210,063, filed on 13 Mar. 2014 now U.S. Pat. No. 9,171,628), which application is incorporated herein.

BACKGROUND

Technical Field

This disclosure generally relates to memory devices.

Description of Related Art

Flash memory is a class of non-volatile integrated circuit memory technology. One type of flash memory employs floating gate memory cells. Another type of memory cell used for flash memory can be referred to as a charge trapping memory cell, which uses a dielectric charge trapping layer in place of the floating gate.

These types of flash memory cell consist of a field effect transistor FET structure having a source and drain separated by a channel, and a gate separated from the channel by a charge storage structure including a tunnel dielectric layer, the charge storage layer (floating gate or dielectric), and a blocking dielectric layer. According to the early charge trapping memory designs referred to as SONOS devices, the source, drain and channel are formed in a silicon substrate (S), the tunnel dielectric layer is formed of silicon oxide (O), the charge storage layer is formed of silicon nitride (N), the blocking dielectric layer is formed of silicon oxide (O), and the gate comprises polysilicon (S). Charge is stored in the charge storage layer by inducing a source-drain current (e.g., by applying a voltage to the gate) that is sufficiently high to move high-energy electrons through the tunnel dielectric layer and trapped in the charge storage structure.

Data is stored in a memory cell of a flash memory device by controlling the amount of charge trapped in the charge storage structure. The amount of charge stored sets a threshold voltage for the memory cell in the flash memory device, which allows the data to be read. Data can be programmed into a flash memory cell by applying voltage pulses to the flash memory cell, causing charge to be stored in the charge storage structure of the flash memory cell. A method for programming a flash memory cell is described in Suh et al., "A 3.3V 32 Mb NAND Flash Memory with Incremental Step Pulse Programming Scheme," IEEE International Solid-State Circuits Conference, 1995, page 128-130. According to Suh, in order to program a target memory cell to achieve a threshold within a range representing a particular data value, a sequence of program/verify steps are executed, in which each program pulse in the sequence causes an incremental change in threshold voltage of the cell, and has a magnitude stepped up relative to the previous pulse. Between each pulse in ISPP, a program verify potential is applied to the word line of the cell, and the data is sensed, to determine whether the cell threshold exceeds the program verify level. The program verify level is set at the low end of the range suitable for the target data value. By inducing incremental changes in threshold, a tighter distribution in thresholds above the program verify level can be achieved.

ISPP and other incremental pulse programming schemes can be applied in page program operations, in which memory cells of a page are programmed in parallel. Because the memory cells in the page are likely to have varying responses to program pulses, and may have varying starting threshold levels, some cells will reach the target threshold level in fewer pulses while some cells will require more pulses. For a page program, the sequence continues until all the cells in the page reach their target, and so systems are designed to execute a relatively large number of steps in the programming sequence. Therefore, incremental pulse programming can take a relatively long time. In operations that are designed to program a large number of pages in a row, such as in a one-time program memory device used to store a large data set or computer program, then the time for programming pages is multiplied many times.

It is desirable to provide a method that reduces the programming time for flash memory, including page mode programming times.

SUMMARY

A method for programming a memory including a plurality of memory cells is described. The method comprises selecting a current cell and executing a pre-program verify operation at a first program verify level. The method comprises executing a program and program verify operation for the current cell, including applying a sequence of program pulses and performing program verify steps. The sequence includes a starting program pulse having a starting magnitude. The program verify steps use a second program verify level, that can be higher than the first program verify level. The method also comprises determining the starting magnitude for a next cell as a function of a magnitude of the program pulse in an instance of the program verify step in which the current cell passes verify at the second program verify level.

Other aspects and advantages of the present technology can be seen on review of the drawings, the detailed description and the claims, which follow.

DETAILED DESCRIPTION

A detailed description of embodiments of the present technology is provided with reference to the Figures.

Figure 1:
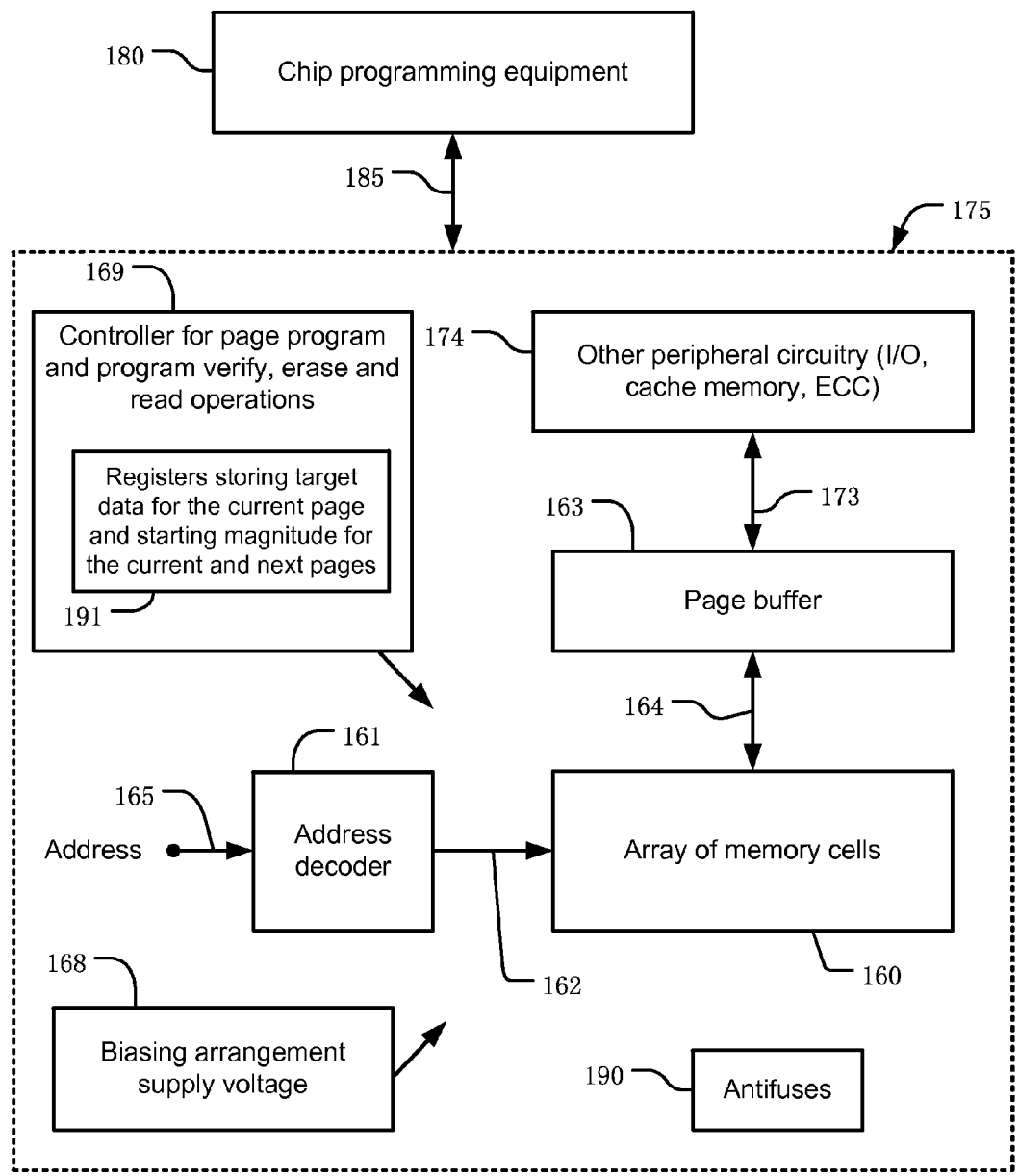
FIG. 1 is a simplified block diagram of a memory.

FIG. 1 is a simplified block diagram of an example memory 175. The memory 175 includes an array 160 of memory cells. The array 160 can include NOR flash memory cells, NAND flash memory cells, or other suitable charge storage memory cells. The array 160 can include memory cells that can be programmed in multiple phases.

An address decoder 161 is coupled to the array 160 via lines 162. Addresses are supplied on bus 165 to the address decoder 161. The address decoder 161 can include word line decoders, bit line decoders, and other suitable decoders that decode the supplied addresses and select corresponding memory cells in the array 160.

Bit lines in the array 160 are coupled via lines 164 to a page buffer 163, which in turn are coupled to other peripheral circuitry 174 via lines 173.

Peripheral circuitry includes circuits that are formed using logic circuits or analog circuits that are not part of the array 160, such as the address decoder 161, controller 169, biasing arrangement supply voltage block 168, and so on. In this example, the block 174 labeled other peripheral circuitry can include input-output (I/O) circuits, cache memory, error-code-correction (ECC) circuits, and other circuit components on the memory 175, such as a general purpose processor or special-purpose application circuitry, or a combination of modules providing system-on-a-chip functionality supported by the array 160. Data is supplied via the lines 173 to I/O ports or to other data destinations internal or external to the memory 175. Data to and from the array 160 can be stored (cached) in the cache memory. The ECC circuit can perform ECC functions (e.g., parity check) on the cached data to ensure integrity of the data to and from the array 160.

The controller 169, implemented for example as a state machine, provides signals to control the application of bias arrangement supply voltage generated or provided through the voltage supply or supplied in block 168 to carry out the various operations described herein. These operations include erase operations, read operations, and page program and program verify operations. The controller is coupled to the address decoder 161, the page buffers 163, and the other peripheral circuitry 174. The controller can be implemented using special-purpose logic circuitry as known in the art. In other embodiments, the controller comprises a general-purpose processor, which may be implemented on the same memory 175, which executes a computer program to control the operations of the device. In yet other embodiments, a combination of special-purpose logic circuitry and a general-purpose processor may be utilized for implementation of the controller.

The page buffer 163 is coupled to bit lines of the array 160, and can include one or more storage elements (e.g., latches) for each bit line connected. The controller 169 can cause the address decoder 161 to select and couple specific memory cells in the array 160 via respective connecting bit lines to the page buffer 163, and cause the page buffer 163 to store data that is written to or read from these specific memory cells. A page of memory cells in the array 160 includes cells that can be accessed in parallel via the page buffer 163. The page width of the array 160 is the number of bits to or from the array 160 (via respective connecting bit lines) that can be stored in parallel in page buffer 163. To provide a high data rate, a large number (e.g., hundreds) of bit lines of the array 160 can be disposed on top of the array 160, coupling a page of selected memory cells to the page buffer 163.

For manufacturing memory devices such as one-time-program (OTP) memory devices, chip programming equipment 180 illustrated in FIG. 1 is used to simultaneously test and program a large quantity of memory devices. As illustrated in FIG. 1, the chip programming equipment 180 can be coupled to the memory 175 via lines 185. The chip programming equipment 180 can program data into the memory 175 by providing the memory 175 a program command with addresses indicating the memory cells that are to be programmed. In response to the program command, the controller 169 performs a program operation by selecting (via the address decoder 161) the memory cells based on the provided addresses and causing the biasing arrangement supply voltage block 168 to apply program pulses (voltage pulses) to the selected memory cells such that threshold voltages of the selected memory cells are elevated to a target level. During the program operation, the memory 175 is in a busy state and is not available to the chip programming equipment 180.

In some embodiments, threshold voltages of the memory cells selected for programming are elevated to the target level in multiple phases. That is, the selected memory cells are programmed in multiple phases. Threshold voltages of the selected memory cells are elevated to successive increasing voltage levels that are lower than the target level in the initial phases, and are elevated to the target level in the final phase. For example, in the first phase of a three-phase operation with a target level of threshold voltage of 7V, program pulses are applied to the selected memory cells to first elevate their threshold voltages to 6V. In the second phase of the three-phase operation, program pulses are applied to the selected memory cells to elevate their threshold voltage to 6.5V. In the third and final phase of the three-phase operation, program pulses are applied to the selected memory cells to elevate their threshold voltage to the target level of 7V. Multiple-phase program operations can alleviate interference in threshold voltages between bits of a multiple-bit nitride-based memory cell.

Between two memory devices of the same design and manufactured with the same manufacturing process, their respective target levels for threshold voltages of programmed memory cells can be different due to variations in manufacturing. The target level for threshold voltages of programmed memory cells included in a memory device can be determined during manufacturing of the memory device (e.g., during wafer sort) and stored in the memory device. For example, the memory 175 can store the target level for threshold voltages of programmed memory cells in antifuses 190 included in the memory 175. The controller 169, in response to a program command from the chip programming equipment 180, accesses the antifuses 190 for the stored target level specific to the memory 175, selects memory cells based on the program command, and causes the biasing arrangement supply voltage block 168 to apply program pulses to raise threshold voltages of the selected memory cells above the specific target level using single-phase or multiple-phase program operations.

Figure 2:
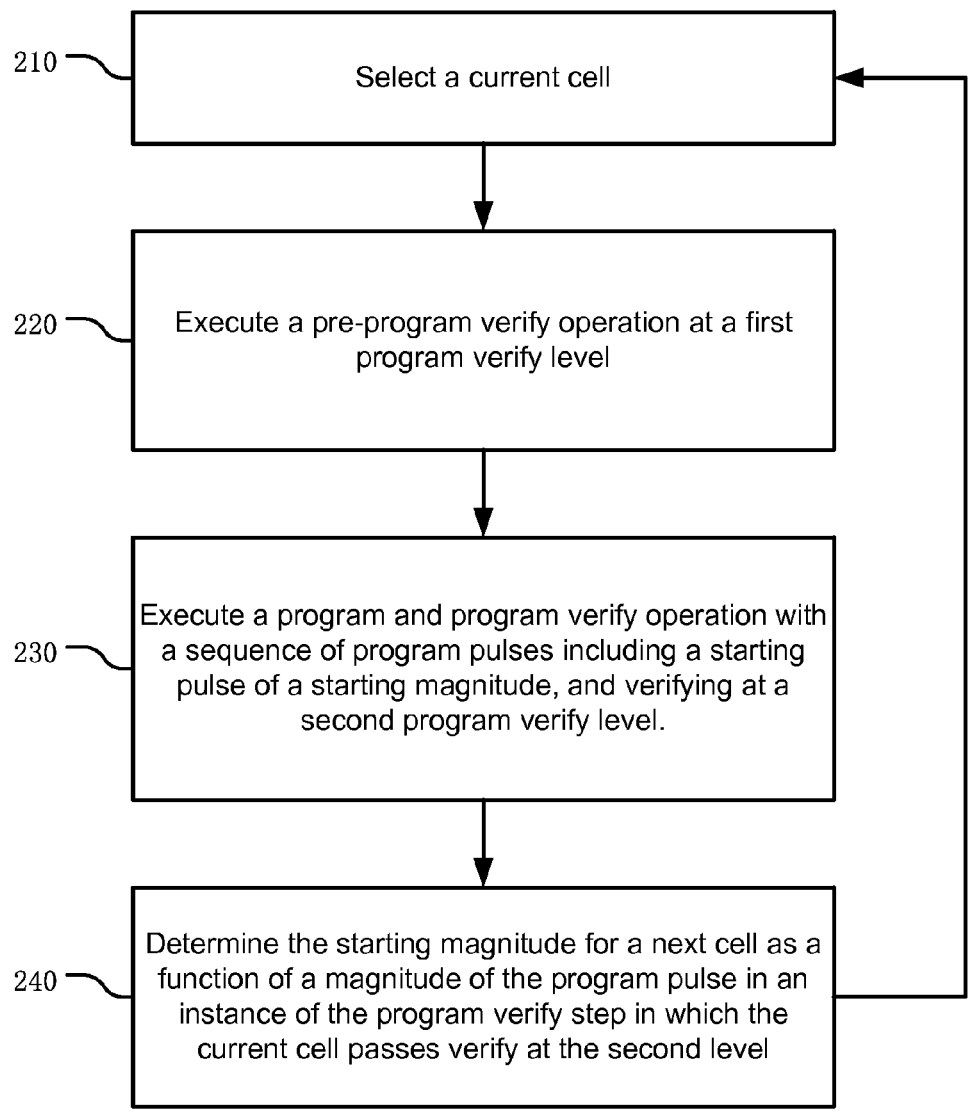
FIG. 2 is a flow chart of an example method for programming a memory.

FIG. 2 is a flow chart of an example method for programming a memory, such as the memory 175 illustrated in FIG. 1. The example method of FIG. 2 can be implemented by the controller 169, the biasing arrangement supply voltage block 168, and other components of the memory 175. The method for programming a memory illustrated in FIG. 2 can be applied for a single-phase program operation or for a particular phase of a multiple-phase program operation. The method is applicable to various configurations such as a page mode (i.e., programming a page at a time) or a cell mode (i.e., programming a cell at a time). The method is also applicable to programing one byte at a time or one word at a time.

For a page mode, the controller 169 first selects a current page and loads data to be programmed to the page. The controller then executes a pre-program verify operation at a first program verify level for target memory cells in the current page that require programming to set the data in the page. For target cells having threshold voltages near or above the first program verify level, the controller 169 masks those passing cells, for example by clearing the corresponding bit in the page buffer, from receiving program pulses. Similarly, for a cell mode, the controller 169 first selects a current cell that requires programming (Step 210). The controller 169 then executes a pre-program verify operation at a first program verify level for the current cell (Step 220). If the current cell has threshold voltage near or above the first program verify level, the controller 169 masks the current cell from receiving program pulses by clearing the corresponding bit in the page buffer.

For the page mode, the controller 169 then executes a program and program verify operation for target cells in the current page that do not pass the pre-program verify operation. In the program and program verify operation, the controller 169 applies to the cells a sequence of program pulses (e.g., provided by the biasing arrangement supply voltage block 168) and performs program verify steps. The sequence has a starting pulse having a starting magnitude, followed by pulses which can be increasing in magnitude or duration or other characteristic that results in incremental shifts in the threshold voltage of the target cells. The sequence can include the program verify steps between the program pulses. The controller 169 executes the program and program verify operation until all memory cells in the current page pass the program verify operations, or an error condition occurs. As in the pre-program verify operation, the controller 169 masks passing cells, for example by clearing the corresponding bit in the page buffer, from receiving program pulses in the succeeding steps of the program and program verify operation. For the cell model, the controller 169 executes the program and program verify operation for the current cell, if the current cell has not passed the pre-program verify operation (Step 230). Similar to the page mode, the controller 169 applies to the current cell a sequence of program pulses and performs program verify steps between the program pulses. The sequence has a starting pulse having a starting magnitude, followed by pulses with increasing magnitudes (or durations). The controller 169 executes the program and program verify operation until the current cell passes the program verify operation. The controller 169 then masks the current cell from receiving additional pulses by clearing the corresponding bit in the page buffer.

During the program and program verify operation, the controller 169 uses a second program verify level for the program verify steps. The second program verify level in this example is higher than the first program verify level by an amount, such as two-hundred millivolts to three-hundred millivolts, to compensate for an uncertainty in determining threshold voltages of cells in the memory 175. The uncertainty in determining cell threshold voltages of a flash memory device may arise from the manufacturing process for the flash memory device, and may further increase as geometry of memory cells decreases. Using the higher level for the second program verify level reduces undesired effects of the uncertainty in determining cell threshold voltages, such as a cell with a threshold voltage lower than a target value being falsely verified as a passing cell. Other embodiments are possible in which the second program verify level may not be higher than the first program level.

For the page mode, the controller 169 determines the starting magnitude of program pulses for a next page as a function of a magnitude of the program pulse in an instance of the program verify step in which one or more cells first pass verify at the second program verify level. Similarly, for the cell mode, the controller 169 determines the starting magnitude of program pulses for a next cell as a function of a magnitude of the program pulse in an instance of the program verify step in which the current cell passes verify at the second program verify level (Step 240). After Step 240, the method illustrated by FIG. 2 is repeated from Step 210 for the next cell (or for the next page). For example, the controller 169 selects the next cell (Step 210), and executes the pre-program verify operation at the first program verify level on the next cell (Step 220). At Step 230, the controller 169 executes the program and program verify operation on the next cell with the starting magnitude of program pulses for the next cell based on the magnitude of the program pulse enabling passing in the current cell. Using the starting magnitude based on the magnitude of the program pulse enabling passing in the current cell (or enabling first passing cells in the current page) instead of starting from a minimal value, the number of program pulses is reduced in the next cell (or in the next page), thus improving the overall program speed of the memory 175.

Figure 3:
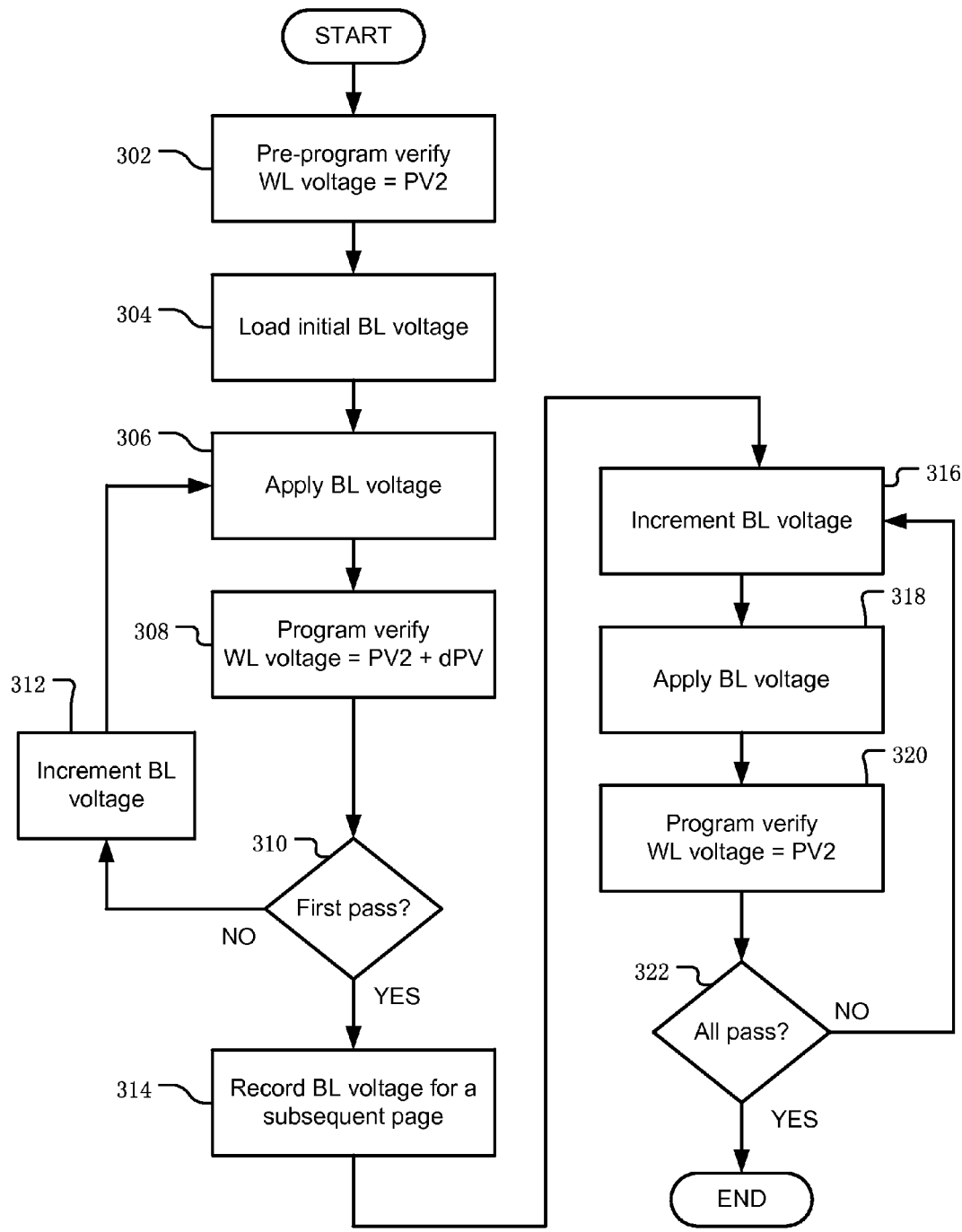
FIG. 3 is a flow chart of another embodiment of a method for programming a memory.

FIG. 3 is a flow chart of another embodiment of the method for programming a memory (e.g., the memory 175) in a page mode. The method for programming a memory illustrated in FIG. 3 can be applied for a single-phase program operation or for a particular phase of a multiple-phase program operation. For illustrative purposes, the flow chart of FIG. 3 is described as applying the pre-program verify operation and the program and program verify operation for the second phase of a three-phase program operation. The first phase of the three-phase program operation elevates threshold voltages of target memory cells to a first level PV1. The second phase of the three-phase program operation then elevates threshold voltages of the target memory cells to a second level PV2. The third and final phase of the three-phase program operations elevates threshold voltages of the target memory cells to a target level PV3. As described earlier, PV1 is less than PV2, which is less than PV3.

The method for programming a memory as illustrated by FIG. 3 can be implemented by the controller 169, the biasing arrangement supply voltage block 168, and other components of the memory 175 illustrated in FIG. 1. As described earlier, the target value PV3 specific to the memory 175 is stored in the antifuses 190. For example, in response to a program command from the chip programming equipment 180, the controller 169 accesses the antifuses 190 for the target value PV3, and executes the three-phase program operation based on logic that is implemented with the controller 169 or a software program executed by the controller 169. The first level PV1 of the first phase and the second level PV2 of the second phase of the three-phase program operation is determined by the controller 169 based on the target value PV3 stored in antifuses 190. For example, if PV3 is 7V, then PV2 can be PV3−0.5V=6.5V, and PV1 can be PV3−1V=6V.

At the start of the flow chart of FIG. 3, the controller 169 selects a page of cells in the array 160 for programming. The selected page of cells corresponds to a particular word line of the array 160.

The controller 169 maintains a target data array (e.g., in registers 191 of the controller 169 or other suitable storage in the memory 175) for data that is going to be programmed into the selected page (e.g., based on the program command from the chip programming equipment 180). Here, for simplicity, a cell that has not been programed has a logical value of "0." A cell that has been programed has a logical value of "1." A cell with a logical value of "1" has charge stored (programmed) in its charge storage structure. The charge causes an elevated threshold voltage (e.g., near or above the target level PV3) in comparison with a lower threshold voltage of a cell with a logical value of "0" that has less negative or positive charge stored in its charge storage structure. A target data value of "0" in the target data array indicates an inhibit status that programming is not applied for the corresponding cell. A target data value of "1" in the target data array indicates a program status that programming is needed for the corresponding cell (a target cell for program pulses); the target cell's logical value is changed from "0" to "1" after its programming is completed. For example, the target data array for a selected page of 8 cells can be "01110011," indicating that programming is needed for the second, third, fourth, seventh, and eighth cells in the selected page.

The controller 169 stores a copy of the target data array in the page buffer 163 and couples bit lines connecting the cells of the selected page to the page buffer 163. The page buffer 163 includes switches such as pass gates. Each switch is configured to couple a bit line connecting a specific cell of the selected page to the biasing arrangement supply voltage block 168 based on a corresponding buffer bit in the page buffer 163. For example, the switch couples the bit line connecting a cell having a stored buffer bit of "1" (a program status) to the biasing arrangement supply voltage block 168 so that the cell can receive program pulses supplied by the biasing arrangement supply voltage block 168. The switch does not couple the bit line connecting a cell having a stored buffer bit of "0" (an inhibit status) to the biasing arrangement supply voltage block 168 so that the cell does not receive program pulses.

For the pre-program verify operation (e.g., Step 220 of FIG. 2), the controller 169 verifies the selected page of cells by causing the biasing arrangement supply voltage block 168 to apply a first program verify voltage of PV2 (the target level for the second-phase operation) to the particular word line, and determining whether respective threshold voltages of cells in the selected page exceed the first program verify voltage PV2 (Step 302) based on sensing the corresponding bit lines. For example, the controller 169 can cause the biasing arrangement supply voltage block 168 to apply a first program verify voltage of 6.5V (PV2) to the particular word line. Meanwhile, the controller 169 can cause the biasing arrangement supply voltage block 168 to apply 1V to corresponding bit lines during verify operations. A cell that is a target cell (e.g., with a target data value of "1") and has a threshold voltage exceeding the pre-program verify voltage PV2 is a passing cell that does not require further programming and will be masked in the following verification.

Figure 4A:
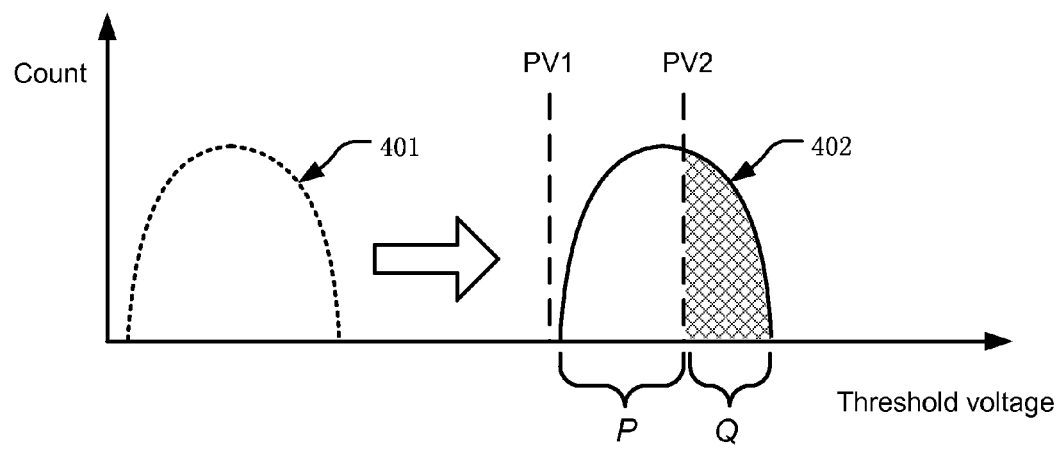
FIG. 4A is an example distribution of threshold voltages of target cells in a selected page after a first phase of a multiphase program operation.

FIG. 4A is an example distribution of threshold voltages of target cells in the selected page after a first phase of a multiphase program operation, including distribution 401 of cells in a low threshold state, and distribution 402 of cells raised above the first level PV1 used in the first phase of the multiphase operation. As determined by the pre-program verify operation, the cells in the region Q are passing cells (with threshold voltages exceeding the pre-program verify voltage PV2) and are masked from any program pulses and the following verification in the second phase. The cells in the region P (with threshold voltage below the first program verify voltage PV2) will receive program pulses and be involved in the first pass bit check in the following verification until they are moved to the right of the dashed line PV2 shown in FIG. 4A. That is, the goal is to elevate threshold voltages of the target cells in the selected page above the first program verify voltage PV2 (the target level of the second-phase operation).

The controller 169 can mask the initial passing cells by updating the copy of the target data array stored in the page buffer 163. For example, in the example target data array "01110011" described above, if the third cell has passed the pre-program verify (at the first program verify level of PV2), the controller 169 updates the copy of the target data array stored in the page buffer 163 to "01010011" by changing the page buffer bit for the third cell from "1" (a program status) to "0" (an inhibit status). These masked bits during pre-program verify will not be involved in the first pass bit check in the following verification.

For the program and program verify operation (e.g., Step 230 of FIG. 2), the controller 169 causes the biasing arrangement supply voltage block 168 to apply a sequence of program pulses to the selected page. The sequence includes a starting pulse with a starting magnitude, and subsequent pulses which increase in magnitude. For example, the starting magnitude can be 3V, while each subsequent pulse is incremented by 100 mV. Meanwhile, the controller 169 can cause the biasing arrangement supply voltage block 168 to apply 10V to the particular word line during program operations. The controller 169 also executes program verify operations at a second program verify level between program pulses.

More particularly, the controller 169 first loads an initial value of bit line voltage for program pulses (Step 304). The initial bit line voltage value (i.e., the starting magnitude for the program pulses) can be a pre-determined value stored in the register 191. The initial bit line voltage value can be based on the magnitude of program pulses enabling first passing cells in previously programmed pages in the array 160, which will be explained in more detail below.

At Step 306, the controller 169 then causes the biasing arrangement supply voltage block 168 to apply a program pulse with the starting magnitude (the initial bit line voltage value in Step 304) to target cells in the selected pages. In the example of the updated copy of target data array "01010011" above, the biasing arrangement supply voltage block 168 applies the program pulse to bit lines coupled to the second, fourth, seventh, and eighth cells in the selected page. Note that the third cell is already masked in the updated copy of target data array and therefore does not receive the program pulse and is not involved in first pass bit check in the following verification. The biasing arrangement supply voltage block 168 can apply the program pulse to the page buffer 163, while the switches of the page buffer 163 described above selectively apply the program pulse to bit lines connecting to specific cells based on the updated page buffer bits stored in the page buffer 163. In another embodiment, the controller 169 causes the biasing arrangement supply voltage block 168 to apply a program pulse to the selected word line with the starting magnitude to target cells in the selected page.

The controller 169 then verifies whether any of the target cells in the selected page (e.g., the second, fourth, seventh, and eighth cells in the 8-bit target data array example above) passes the programming by causing the biasing arrangement supply voltage block 168 to apply to the particular word line (corresponding to the selected page) a voltage at a second program verify level of PV2+dPV (Step 308), and determining whether any of the target cells has a threshold voltage exceeding the second program verify level of PV2+ dPV (Step 310) based on sensing at corresponding bit lines. The second program verify level for verifying the first cell pass is higher than the first program verify level (PV2) by the amount of dPV. The amount of dPV is set to compensate for uncertainty in determining threshold voltages of the cells in memory. For example, the uncertainty in determining cell threshold voltages can be estimated to be +/−300 mV. In this example, dPV can be 350 mV. As discussed earlier, for determining the first passing cells, the higher second program verify level PV2+dPV is applied to the particular word line to alleviate undesired effects (e.g., falsely verified cells) associated with the uncertainty in determining cell threshold voltages.

If no target cell in the selected page passes the second program verify level of PV2+dPV, the biasing arrangement supply voltage block 168 increments (e.g., by 100 mV) the bit line voltage value (Step 312), and repeats the loop of Steps 312, 306, 308, and 310, until at least one target cell passes the second program verify level of PV2+dPV. In another embodiment, the controller 169 causes the biasing arrangement supply voltage block 168 to apply program pulses as described in the loop of Steps 312, 306, 308, and 310 to the selected word line of the target cells in the selected page.

Figure 4B:
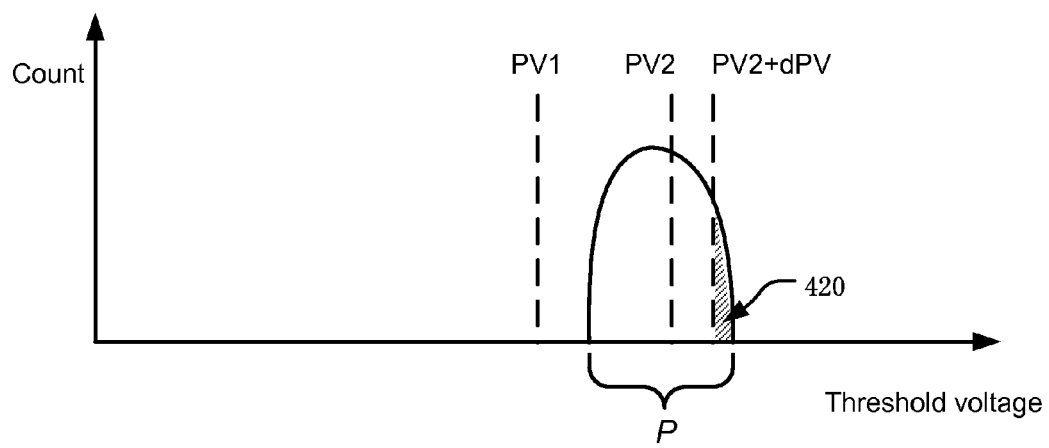
FIG. 4B is an example distribution of threshold voltages of target cells receiving program pulses in a second phase of a multiphase program operation.

As similarly described with Step 240 of FIG. 2, in an instance that at least one target cell in the selected page passes the second program verify level of PV2+dPV, that is, if one, two, or more target cells in the selected page pass the second program verify level of PV2+dPV, the controller 169 records the magnitude or the bit line voltage value of the program pulse used in the first program cycle (or in another later program cycle if desired, such as the second program cycle) in which the one or more cells pass the second program verify level of PV2+dPV (Step 314). The recorded bit line voltage value is used for determining the starting magnitude of program pulses of a next page subsequently to be programmed, as will be described in more detail later. Meanwhile, the controller 169 stores the recorded bit line voltage and the starting magnitude of program pulses for the next page in the registers 191. In addition, the controller 169 masks the one or more passing cells from further program pulses. The controller 169 masks the passing cells by updating the copy of the target data array stored in the page buffer 163, as described earlier. FIG. 4B is an example distribution of threshold voltages of target cells receiving program pulses. Note that these target cells are the ones in the P-region shown in FIG. 4A that are not masked by the pre-program verify operation (Step 302). This diagram illustrates that the thresholds are moved incrementally, so that after one or more program pulses the lower end of the distribution remains below PV2 but above PV1, and the upper end of the distribution is moved above PV2, and in the illustrated distribution, the upper end is moved above PV2+ dPV. As shown in FIG. 4B, target cells with threshold voltages higher than the second program verify level of PV2+dPV (shaded region 420) are masked from further program pulses.

Figure 4C:
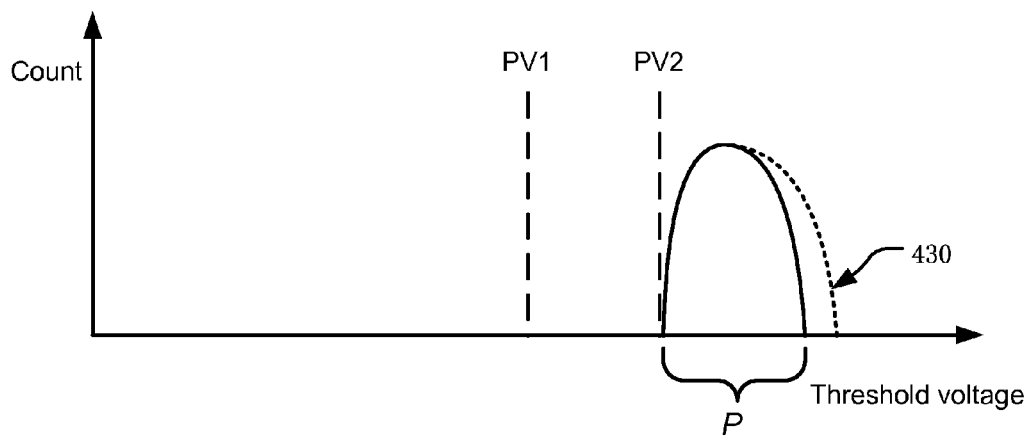
FIG. 4C is an example distribution of threshold voltages of target cells illustrated in FIG. 4A after programming of the second phase operation is completed.

After the first program cycle (or another selected cycle) in which a cell passes, the biasing arrangement supply voltage block 168 increments (e.g., by 100 mV) the bit line voltage value (Step 316), then applies a program pulse with the incremented bit line voltage value to the target cells (based on the updated target data array) in the selected page (Step 318). The controller 169 then verifies whether all of the target cells in the selected page pass the programming by causing the biasing arrangement supply voltage block 168 to apply to the particular word line (corresponding to the selected page) a voltage at a third program verify level of PV2 (Step 320), and determining whether all the target cells in the selected page pass at the third program verify level of PV2 based on sensing at corresponding bit lines (Step 322). If at least one target cell in the selected page does not pass at the third program verify level of PV2, the controller 169 masks any target cells that already pass at the third program verify level of PV2 by updating the copy of target data array, and repeating the loop of Steps 316, 318, 320, and 322, until all cells in the selected page pass the programming, as illustrated in FIG. 4C. In another embodiment, the controller 169 causes the biasing arrangement supply voltage block 168 to apply program pulses as described in the loop of Steps 316, 318, 320, and 322 to the selected word line of the target cells in the selected page. FIG. 4C is an example distribution of threshold voltages of target cells illustrated in FIG. 4A after programming of the second-phase operation is complete. As shown in FIG. 4C, threshold voltages of the target cells in the selected page are, as intended, higher than the third program verify level of PV2. The distribution of the threshold voltages of the target cells can be widened (as indicated by the dashed distribution curve 430) due to the high voltage level of the word line voltage applied for the program verify operations. To reduce the widening of the distribution of the threshold voltages of the target cells that can result for use of the higher second program verify level, the program verify level of the word line voltage is reversed back to PV2 for program verify operations after first pass bit occurs. That is the "third program verify level" that is lower than the second program verify level PV2+dPV, and typically is the same as the first program verify level.

The controller 169 may determine an error condition has occurred and abort the program and program verify operation. For example, if more than a pre-determined number (e.g., 20) of program pulses have been applied for the program and program verify operation, the controller 169 determines an error condition has occurred, and aborts the programming for the currently selected page.

Figures 5A, 5B:
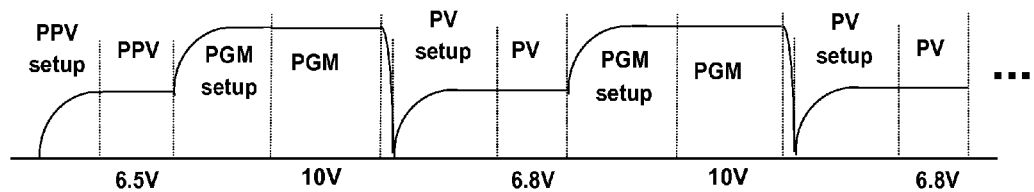
FIG. 5A illustrates example word line and bit line voltages used for the method of programming a memory of a plurality of pages as described in FIG. 3.
FIG. 5B illustrates example waveforms of the word line voltages described in FIG. 5A.

FIG. 5A illustrates example word line and bit line voltages used for the method of programming a memory of a plurality of pages as described in FIG. 3. In FIG. 5A and in FIG. 5B discussed below, "PPV" is the pre-program verify step described in FIG. 3; "PGM" refers to the program steps described in FIG. 3; "PV" refers to the program verify steps described in FIG. 3. As illustrated in FIG. 5A, for the pre-program verify step (Step 302) of FIG. 3, a pre-program verify voltage of PV2=6.5V is applied to a word line of a particular page. For the pre-program verify step, a bias voltage of 1V is applied to corresponding bit lines of the particular page. For program steps (Steps 306 and 318) described in FIG. 3, an initial program pulse of 3V is applied to the bit lines, while each subsequent program pulse applied to the bit lines is incremented by 100 mV (3.1V, 3.2V, 3.2V, and so on) until all cells pass (e.g., bit line voltage=5.1V). A bias voltage of 10V is applied the word line during the program steps. For program verify steps, a program verify voltage of 6.5V+300 mV=6.8 V (PV2+dPV) is applied to the word line (Step 308 of FIG. 3) until first cells pass. After the first cells pass, a program verify voltage of 6.5V (PV2) is applied to the word line (Step 320 of FIG. 3) until all cells pass. A bias voltage of 1V is applied to the bit lines during the program verify steps.

FIG. 5B illustrates example waveforms of the word line voltages described in FIG. 5A. As illustrated in FIG. 5B, the word line voltage is ramped up to 6.5V in a pre-program verify setup (PPV setup) phase and then applied to the word line in the pre-program verify step. The word line voltage is subsequently ramped up to 10V in a program setup (PGM setup) phase and then applied to the word line in the program step. The word line voltage is then ramped down and ramped up to 6.8V in a program verify step (PV setup) phase and then applied to the word line in the program verify step. The word line voltage is subsequently ramped up to 10V in a program setup phase and then applied to the word line in the program step. Afterwards, the word line voltage is similarly ramped down and ramped up for subsequent program verify and program steps.

The method illustrated by FIG. 3 is repeated for the next page to be programmed. More particularly, the recorded bit line voltage value for the program cycle in which cells pass in the selected page (Step 314) is used to generate a starting magnitude or an initial bit line voltage value (as described with Step 304) of program pulses for the next page. The starting magnitude of program pulses for the next page can be set at a level less than the recorded bit line voltage value by a reduction amount to avoid "over programming" at the next page (e.g., a higher than sufficient bit line voltage level of the initial program pulse).

As described earlier, the starting magnitude of program pulses for a next page is based on the recorded bit line voltage value for the target cells that receive program pulses (the cells in the P-region illustrated in FIGS. 4A and 4B). That is, the starting magnitude of program pulses for the next page is based on the recorded bit line voltage that effectively raises threshold voltages of target cells in the previously programmed page.

Figure 6:
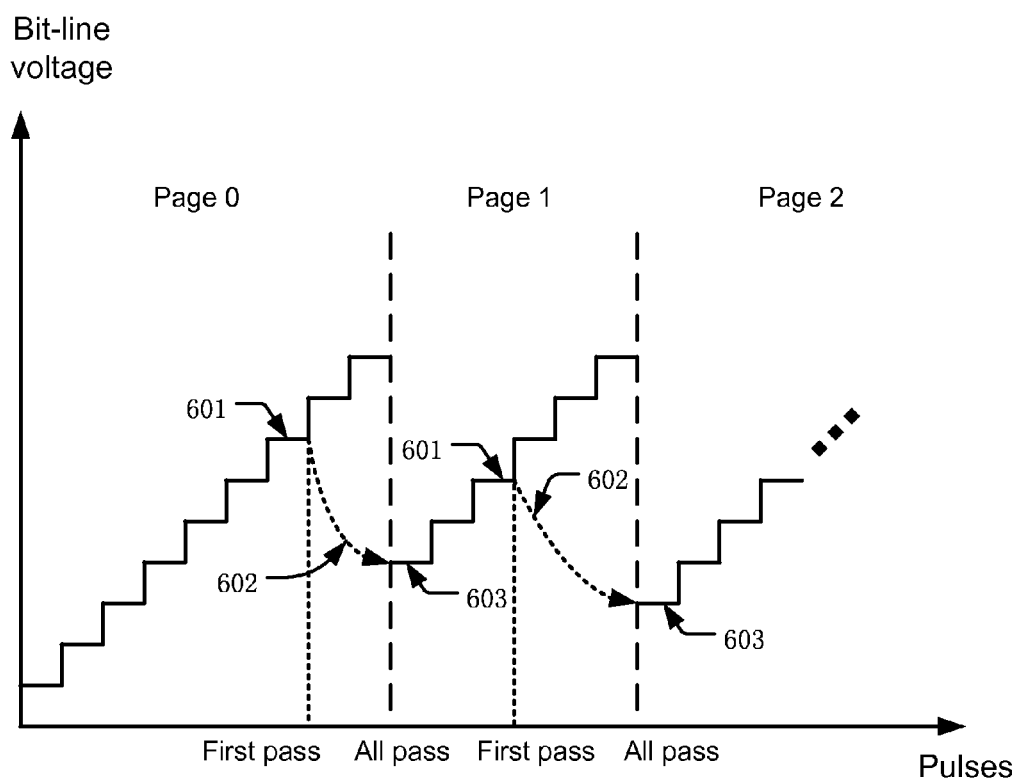
FIG. 6 illustrates example bit line voltages of program pulses for programming pages of memory cells of a memory device.

FIG. 6 illustrates example bit line voltages of program pulses for programming pages of memory cells of a memory device as described with FIG. 3. For each page of the memory device, successive increasing program pulses (as illustrated with increasing steps in bit line voltages) are applied to bit lines coupled to target cells. As illustrated in FIG. 6, for each page, bit line voltages are applied while first pass bits are determined (from Step 304 and through the loop of Steps 306, 308, 310 and 312 of FIG. 3). The bit line voltages continue to be applied until all bits pass for the page (the loop of Steps 316, 318, 320, and 322 of FIG. 3). As illustrated in FIG. 6, the bit line voltage value 601 when cells first pass for a current page is decreased by an amount 602 (e.g., 300 mV) to determine the initial bit line voltage value 603 (the starting magnitude of program pulses) for its next page. The amount 602 can range from 300 mV to 1200 mV. As the initial bit line voltage value 603 (the starting magnitude) for program pulses for a current page is determined based on the bit line voltage 601 when cells first pass in its previous page instead of starting from a minimal value (e.g., 2500 mV), the number of program pulses needed to reach the first cell pass is reduced, thus the speed of programming of the page is increased.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A method of programming a plurality of memory cells, comprising:
    selecting a cell;
    executing a pre-program verify operation at a pre-program verify level for the cell;
    executing a program and program verify operation for the cell including applying a sequence of program pulses, the sequence including a starting pulse having a starting magnitude, the program and program verify operation including performing program verify steps using a program verify level; and
    determining the starting magnitude for a next cell as a function of a magnitude of the starting pulse in an instance of the program verify steps in which the cell passes verify at the program verify level; wherein the pre-program verify level is lower than the program verify level.

2. The method of claim 1, further comprising using a subsequent program verify level for the cell after the instance, wherein the subsequent program verify level is lower than the program verify level.

3. The method of claim 2, wherein the pre-program verify level is equal to the subsequent program verify level.

4. The method of claim 1, wherein the cell and the next cell are in different pages.

5. The method of claim 1, wherein the starting magnitude for the next cell is less than the magnitude of the starting pulse in the instance for the cell.

6. The method of claim 1, wherein the program pulses in the sequence include voltages of increasing magnitude on a bit line coupled to the cell.

7. The method of claim 1, wherein the instance is a first instance in the sequence of the program verify steps in which the cell passes verify at the program verify level.

8. A memory comprising:
    a plurality of memory cells; and
    logic configured to:
        select a cell in the plurality of memory cells;
        executing a pre-program verify operation at a pre-program verify level for the cell;
        execute a program and program verify operation for the cell including applying a sequence of program pulses, the sequence including a starting pulse having a starting magnitude, the program and program verify operation including performing program verify steps using a program verify level; and
        determine the starting magnitude for a next cell as a function of a magnitude of the starting pulse in an instance of the program verify step in which the cell passes verify at the program verify level; wherein the pre-program verify level is lower than the program verify level.

9. The memory of claim 8, wherein the logic is configured to repeat said select a cell in the plurality of memory cells; said execute a program and program verify operation for the cell; and said determine the starting magnitude for a next cell in the plurality of memory cells.

10. The memory of claim 8 wherein the logic is configured to use a subsequent program verify level for the cell after the instance, wherein the subsequent program verify level is lower than the program verify level.

11. The memory of claim 8, wherein the program pulses in the sequence include voltages of increasing magnitude on a bit line coupled to the cell.

12. The memory of claim 8, wherein the starting magnitude for the next cell is less than the magnitude of the starting pulse in the instance for the cell.

13. The memory of claim 8, wherein the instance is a first instance in the sequence of the program verify steps in which the cell passes verify at the program verify level.

14. A method of programming a plurality of memory cells, comprising:
   selecting a cell;
   executing a pre-program verify operation at a pre-program verify level for the cell;
   executing a program and program verify operation for the cell including applying a sequence of program pulses, the sequence including a starting pulse having a starting magnitude, the program and program verify operation including performing program verify steps using a program verify level until an instance of the program verify steps in which the cell passes verify at the program verify level, and performing program verify steps using a subsequent program verify level for the cell after said instance; and
   determining the starting magnitude for a next cell as a function of a magnitude of the program starting pulse in said instance of the program verify steps in which the cell passes verify at the program verify level; wherein the pre-program verify level is equal to the subsequent program verify level.

* * * * *

UNITED STATES PATENT AND TRADEMARK OFFICE
CERTIFICATE OF CORRECTION

PATENT NO. : 9,679,653 B2
APPLICATION NO. : 14/862064
DATED : June 13, 2017
INVENTOR(S) : Ming-Chao Lin et al.

Page 1 of 1

It is certified that error appears in the above-identified patent and that said Letters Patent is hereby corrected as shown below:

In the Claims

In Claim 14, Column 13, Line 23, delete "program".

Signed and Sealed this
Eighth Day of August, 2017

Joseph Matal
*Performing the Functions and Duties of the*
*Under Secretary of Commerce for Intellectual Property and*
*Director of the United States Patent and Trademark Office*